US010383256B2

(12) United States Patent
Cho et al.

(10) Patent No.: US 10,383,256 B2
(45) Date of Patent: Aug. 13, 2019

(54) SYSTEMS AND METHODS FOR PREVENTING AIRFLOW RECIRCULATION IN AN INFORMATION HANDLING SYSTEM

(71) Applicant: Dell Products L.P., Round Rock, TX (US)

(72) Inventors: Shih-Huai Cho, New Taipei (TW); Hung-Pin Chien, New Taipei (TW); Yu-Hung Wang, Tainan (TW)

(73) Assignee: Dell Products L.P., Round Rock, TX (US)

( * ) Notice: Subject to any disclaimer, the term of this patent is extended or adjusted under 35 U.S.C. 154(b) by 320 days.

(21) Appl. No.: 15/058,947

(22) Filed: Mar. 2, 2016

(65) Prior Publication Data
US 2017/0257984 A1    Sep. 7, 2017

(51) Int. Cl.
*H05K 7/20* (2006.01)
(52) U.S. Cl.
CPC ..... *H05K 7/20727* (2013.01); *H05K 7/20181* (2013.01)
(58) Field of Classification Search
CPC .. G06F 1/20; G06F 1/206; H05K 7/20; H05K 7/20009; H05K 7/20136; H05K 7/20145; H05K 7/207; H05K 7/20709; H05K 7/20645; H05K 7/20636; H05K 7/20618; H05K 7/20836
USPC .... 454/184; 415/146, 211.2, 26, 48, 49, 208
See application file for complete search history.

(56) References Cited

U.S. PATENT DOCUMENTS

| | | | | |
|---|---|---|---|---|
| 2,499,743 | A * | 3/1950 | Goodman | A63H 15/06 446/325 |
| 2010/0003126 | A1 * | 1/2010 | Wang | F04D 25/0613 415/146 |
| 2013/0231041 | A1 * | 9/2013 | Li | F24F 13/082 454/318 |

* cited by examiner

*Primary Examiner* — Steven B McAllister
*Assistant Examiner* — Ko-Wei Lin
(74) *Attorney, Agent, or Firm* — Jackson Walker L.L.P.

(57) ABSTRACT

As an air mover assembly is translated from a first orientation to a second orientation, a first roller and a second roller translate about at least one rail such that the a frame and a door maintain a position relative to the direction of the force of gravity.

15 Claims, 8 Drawing Sheets

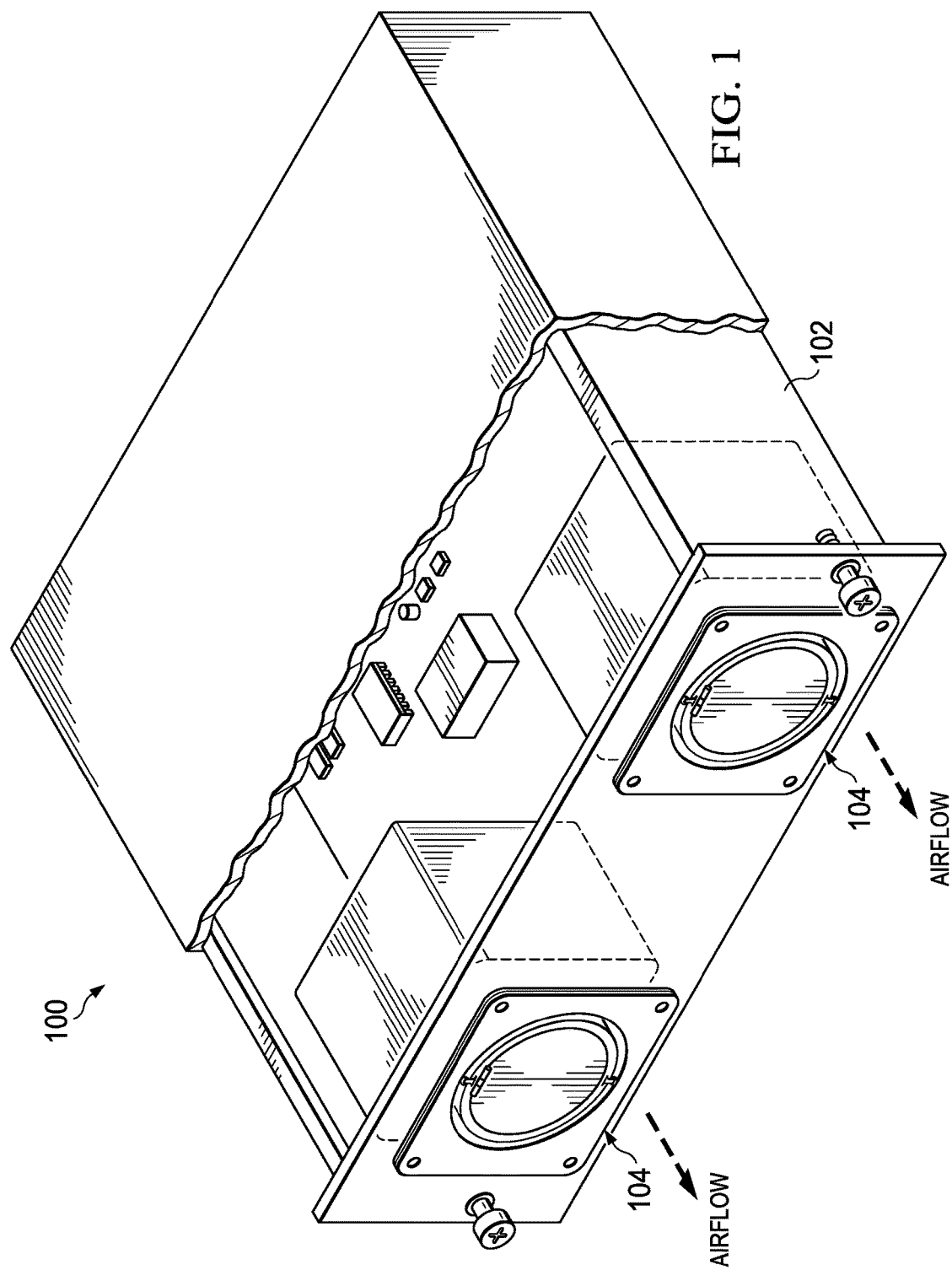

SYSTEMS AND METHODS FOR PREVENTING AIRFLOW RECIRCULATION IN AN INFORMATION HANDLING SYSTEM

TECHNICAL FIELD

The present disclosure relates in general to information handling systems, and more particularly preventing airflow recirculation in a system for cooling an information handling system and components thereof.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, cooling fans and blowers, referred to generally herein as "air movers," have often been used in information handling systems to cool information handling systems and their components.

Often, air movers are used in a redundant configuration in information handling systems, wherein a plurality of air movers are installed, configured, and arranged such that in case of a fault of one air mover, the remaining air movers may be sufficient to meet the cooling needs of the information handling system. However, during a fan fault, it may be necessary to reduce recirculation of air by reducing or eliminating passage of air through the exhaust of a failed or faulted fan.

SUMMARY

In accordance with the teachings of the present disclosure, the disadvantages and problems associated with airflow recirculation in a cooling system of an information system and components thereof may be substantially reduced or eliminated.

In accordance with embodiments of the present disclosure, an air mover assembly may include an air mover and a housing mechanically coupled to the air mover. The housing may include an exhaust assembly comprising a first roller having a first mass, a second roller having a second mass substantially larger than the first mass, at least one generally arcuate rail for constraining motion of the first roller and the second roller within the at least one arcuate rail, a generally circular frame rotatably coupled to the first roller and the second roller at an approximate circumference of the frame, such that the first roller and the second roller are located diametrically opposite of one another on the approximate circumference, and a door hingedly coupled to the frame and configured to assume a closed position under a force of gravity on the door in the absence of airflow generated by the air mover and configured to rotate from the closed position to an open position under a force of airflow from the air mover that overcomes the force of gravity on the door. As the air mover assembly is translated from a first orientation to a second orientation, wherein in the first orientation and the second orientation a plane defined by a circle defined at least in part by the at least one rail is generally parallel to a direction of the force of gravity, the first roller and the second roller translate about the at least one rail such that the frame and the door maintain a position relative to the direction of the force of gravity.

In accordance with embodiments of the present disclosure, an information handling system may include a chassis and an air mover assembly coupled to the chassis. The air mover assembly may include an air mover and a housing mechanically coupled to the air mover. The housing may include an exhaust assembly comprising a first roller having a first mass, a second roller having a second mass substantially larger than the first mass, at least one generally arcuate rail for constraining motion of the first roller and the second roller within the at least one arcuate rail, a generally circular frame rotatably coupled to the first roller and the second roller at an approximate circumference of the frame, such that the first roller and the second roller are located diametrically opposite of one another on the approximate circumference, and a door hingedly coupled to the frame and configured to assume a closed position under a force of gravity on the door in the absence of airflow generated by the air mover and configured to rotate from the closed position to an open position under a force of airflow from the air mover that overcomes the force of gravity on the door. As the air mover assembly is translated from a first orientation to a second orientation, wherein in the first orientation and the second orientation a plane defined by a circle defined at least in part by the at least one rail is generally parallel to a direction of the force of gravity, the first roller and the second roller translate about the at least one rail such that the frame and the door maintain a position relative to the direction of the force of gravity.

In accordance with embodiments of the present disclosure, a housing for housing an air mover may include an exhaust assembly comprising include an air mover and a housing mechanically coupled to the air mover. The housing may include an exhaust assembly comprising a first roller having a first mass, a second roller having a second mass substantially larger than the first mass, at least one generally arcuate rail for constraining motion of the first roller and the second roller within the at least one arcuate rail, a generally circular frame rotatably coupled to the first roller and the second roller at an approximate circumference of the frame, such that the first roller and the second roller are located diametrically opposite of one another on the approximate circumference, and a door hingedly coupled to the frame and configured to assume a closed position under a force of gravity on the door in the absence of airflow generated by the air mover and configured to rotate from the closed position to an open position under a force of airflow from the air mover that overcomes the force of gravity on the door. As the housing is translated from a first orientation to a second orientation, wherein in the first orientation and the second orientation a plane defined by a circle defined at least in part by the at least one rail is generally parallel to a direction of the force of gravity, the first roller and the second roller translate about the at least one rail such that the frame and the door maintain a position relative to the direction of the force of gravity.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 1 illustrates a block diagram of an example information handling system having one or more air mover assemblies for cooling information handling resources, in accordance with the present disclosure;

DETAILED DESCRIPTION

Figure 2A:
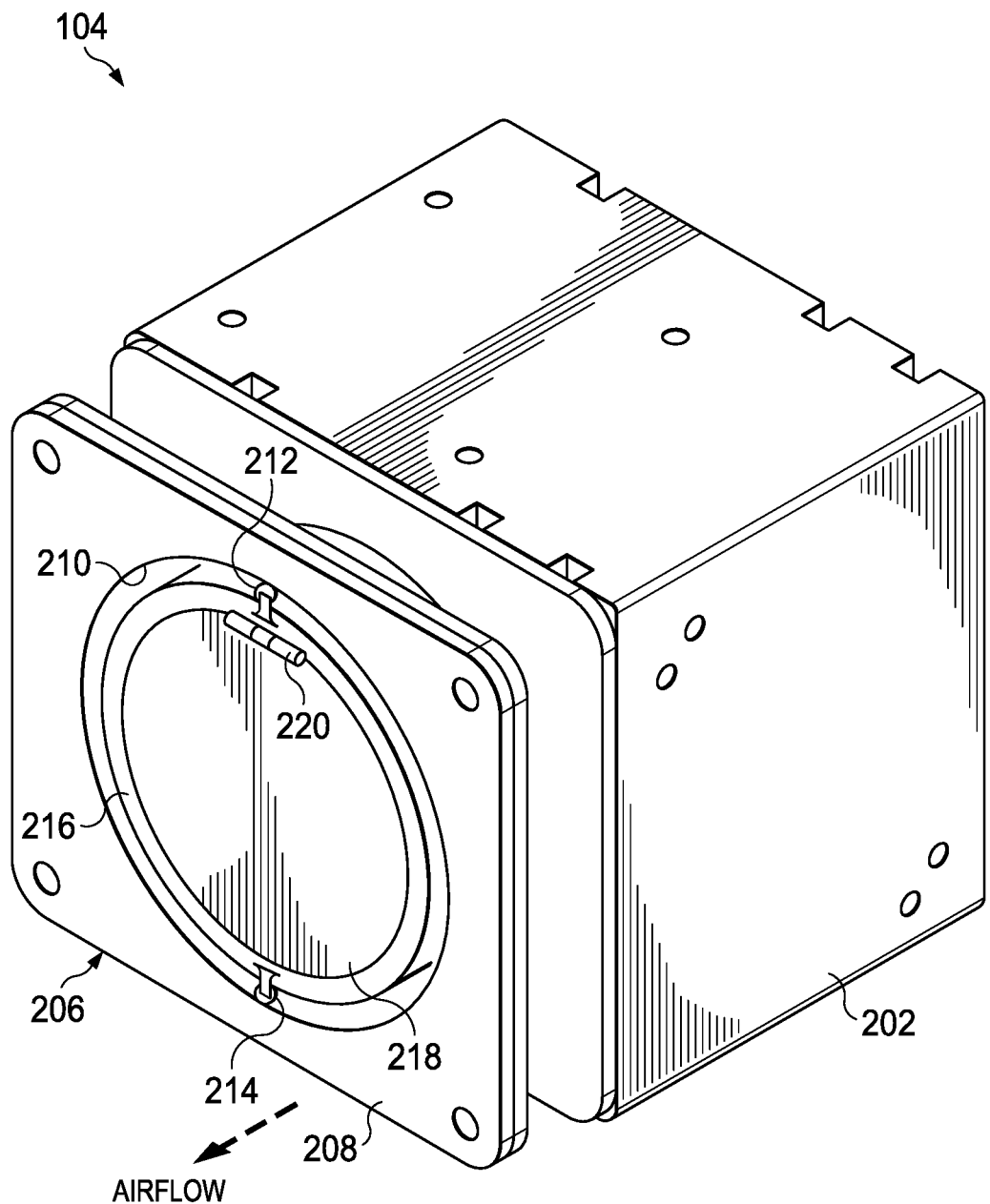
FIGS. 2A-2E illustrate various schematic views of an example air mover assembly, in accordance with the present disclosure.

Preferred embodiments and their advantages are best understood by reference to FIGS. 1-5C, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, information handling resources may broadly refer to any component system, device or apparatus of an information handling system, including without limitation processors, buses, memories, input-output devices and/or interfaces, storage resources, network interfaces, motherboards, integrated circuit packages; electro-mechanical devices (e.g., air movers), displays, and power supplies.

FIG. 1 illustrates a block diagram of an example information handling system 100 having one or more air mover assemblies 104 for cooling information handling resources of information handling system 100, in accordance with the present disclosure. In some embodiments, an information handling system 100 may comprise a server chassis configured to house a plurality of servers or "blades." In other embodiments, information handling system 100 may comprise a personal computer (e.g., a desktop computer, laptop computer, mobile computer, and/or notebook computer). In yet other embodiments, information handling system 100 may comprise a storage enclosure configured to house a plurality of physical disk drives and/or other computer-readable media for storing data.

As depicted in FIG. 1, information handling system 100 may include a chassis 102 having a plurality of air mover assemblies 104. Chassis 102 may be an enclosure that serves as a container for various information handling resources of information handling system 100, and may be constructed from steel, aluminum, plastic, and/or any other suitable material. Although the term "chassis" is used, chassis 102 may also be referred to as a case, cabinet, tower, box, enclosure, and/or housing.

Each of air mover assemblies 104 may be any mechanical or electro-mechanical system, apparatus, or device operable to move air and/or other gases. In certain embodiments, air mover assemblies 104 may draw cool air into chassis 102 from the outside, expel warm air from inside chassis 102, and/or move air across one or more heatsinks (not explicitly shown) internal to chassis 102 to cool one or more information handling resources of information handling system 100. The structure and function of air mover assemblies 104 may be described in greater detail below with respect to FIGS. 2A-2E, FIGS. 3A-3C, and FIGS. 4A and 4B.

Although information handling system 100 is depicted as including two air mover assemblies 104, information handling system 100 may include any number of air mover assemblies 104. In addition, although a particular configuration of air mover assemblies 104 is depicted, air mover assemblies 104 may be configured in any suitable manner.

Figure 2B:
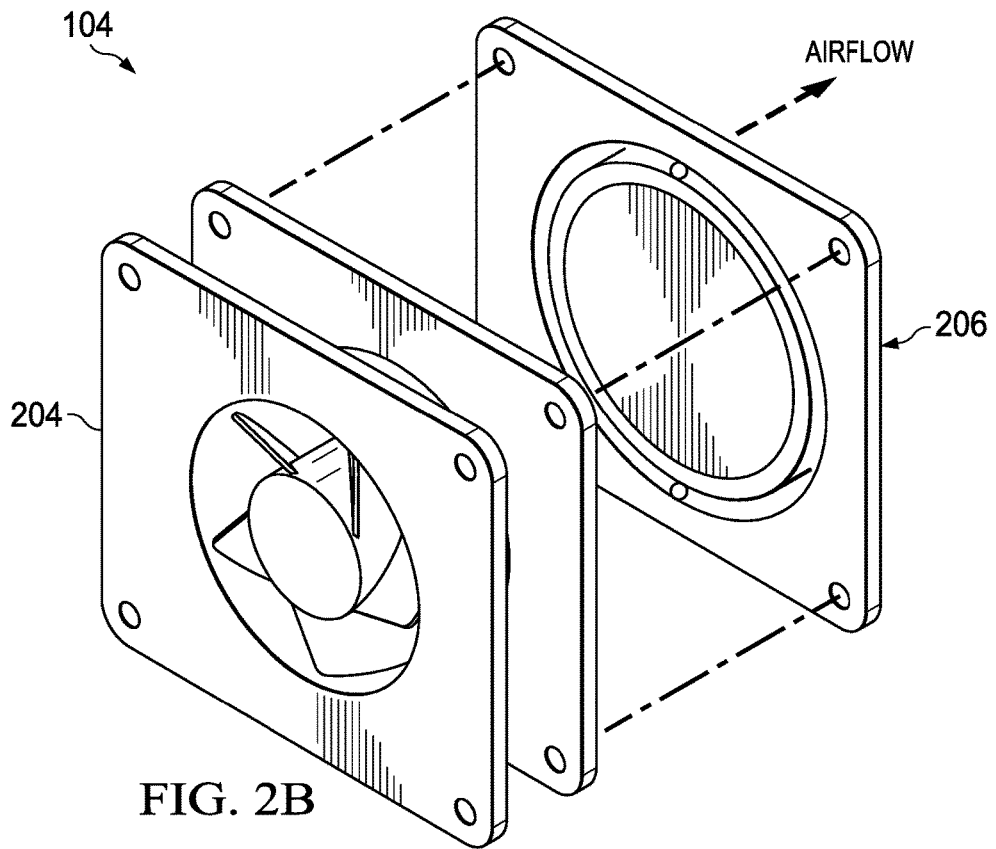
Figure 2C:
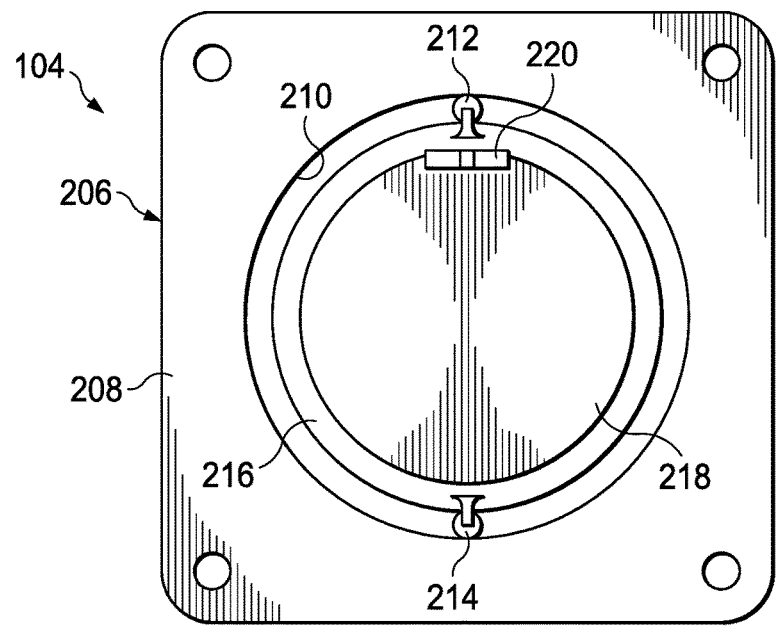
Figure 2D:
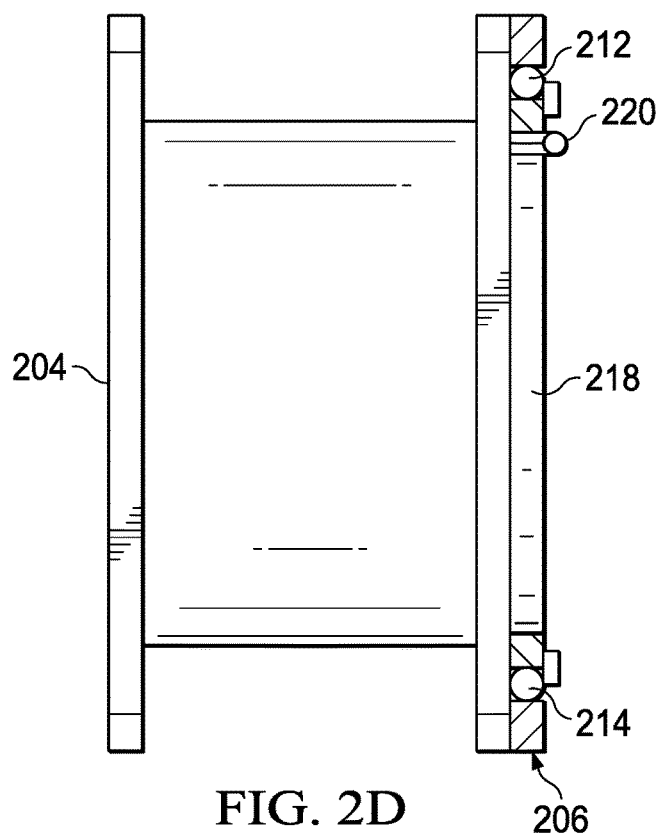
Figure 2E:
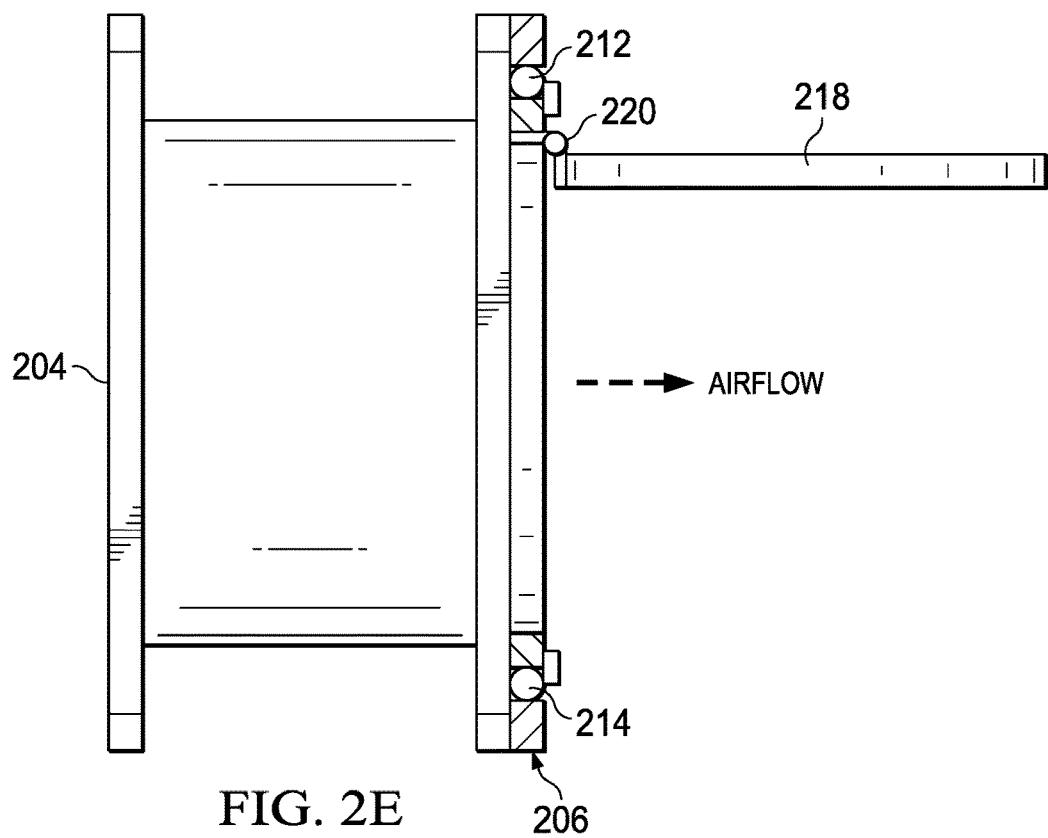

FIGS. 2A-2E illustrate various schematic views of an example air mover assembly 104, in accordance with the present disclosure. In particular, FIG. 2A illustrates a perspective assembled view depicting an exhaust portion of example air mover assembly 104, FIG. 2B illustrates a different perspective of an exploded schematic view of selected components of example air mover assembly 104 with a housing member 202 thereof removed, FIG. 2C illustrates a front elevation view of selected components of example air mover assembly 104, FIG. 2D illustrates a side view of selected components of example air mover assembly 104 with a door 218 in a closed position, and FIG. 2E illustrates a side view of selected components of example air mover assembly 104 with a door 218 in an open position.

As shown in FIGS. 2A-2E, air mover assembly 104 may include housing member 202, air mover 204, and an exhaust assembly 206 comprising exhaust plate 208, rail 210, roller 212, roller 214, frame 216, door 218, and hinge 220.

Housing member 202 may be configured to exhaust plate 208 of exhaust assembly 206 to form a housing for various components of air mover assembly 104, including air mover 204. Housing member 202 constructed from steel, aluminum, plastic, and/or any other suitable material. Although the term "housing" is used to describe housing member 202, such structure may also be referred to as an enclosure and/or container. Housing member 202 may comprise one or more flanges and/or one or more openings configured to receive a fastener (e.g., screw, nut, and/or bolt) for mechanically coupling and/or mounting another component of air mover assembly 104 to housing member 202.

Exhaust assembly 206 may be configured to mechanically couple to housing member 202 (e.g., via one or more flanges, one or more fasteners, and/or one or more openings configured to receive fasteners), and may include openings, features, or other structures configured to guide or direct air exhausted by air mover assembly 104 (e.g., guide air externally to chassis 102). Exhaust assembly 206 may be constructed from steel, aluminum, plastic, and/or any other suitable material. As shown in FIG. 2B, air mover 204 may be mounted to exhaust assembly 206 (e.g., via one or more flanges, one or more fasteners, and/or one or more openings configured to receive fasteners) such that when in operation, air mover 204 draws air into air mover 204 and exhausts such air externally to chassis 102 through exhaust assembly 206.

As shown in FIGS. 2A and 2C, exhaust plate 208 may have formed therein rail 210. Rail 210 may be generally circular in shape (e.g., forming a circular ring), and serve as a bearing including features necessary to guide and constrain roller 212 and roller 214 within the circular shape defined by rail 210, such that roller 212 and roller 214 may roll within the confines of rail 210.

Each of roller 212 and roller 214 may be of any suitable shape allowing each of roller 212 and roller 214 to roll throughout rail 210. Accordingly, in some embodiments, roller 212 and/or roller 214 may be wheel-shaped or generally cylindrical in shape. In these and other embodiments, roller 212 and/or roller 214 may be generally spherical in shape. Roller 214 may have significantly more mass than roller 212.

As shown in FIGS. 2A-2E, each of roller 212 and roller 214 may be rotationally coupled to frame 216. For example, frame 216 may have flanges extending therefrom that couple to axles passing through each of roller 212 and roller 214 approximately at the outer circumference of frame 216. As shown in FIGS. 2A-2E, frame 216 may be generally circular in nature (e.g., forming a circular ring), and may be substantially co-centric with rail 210. Accordingly, as roller 212 and roller 214 translate within rail 210, frame 216 may rotate within rail 210. Also as shown in FIGS. 2A-2E, roller 212 and roller 214 may be coupled at diametrically opposite locations of the generally circular frame 216.

As depicted in FIGS. 2A-2E, a door 218 may be coupled to frame 216 via a hinge 220. As so arranged, when air mover 204 is not operational (e.g., due to being powered down or due to suffering an operational fault or failure), the effect of gravity on door 218 may cause door 218 to assume a closed position, as shown in FIG. 2D. On the other hand, when air mover 204 is operational and driving a flow of air, the force of pressure of such airflow on door 218 may overcome that of the gravitational force on door 218, such that door 218 rotates about hinge 220 to an open position, as shown in FIG. 2E.

Figure 3A:
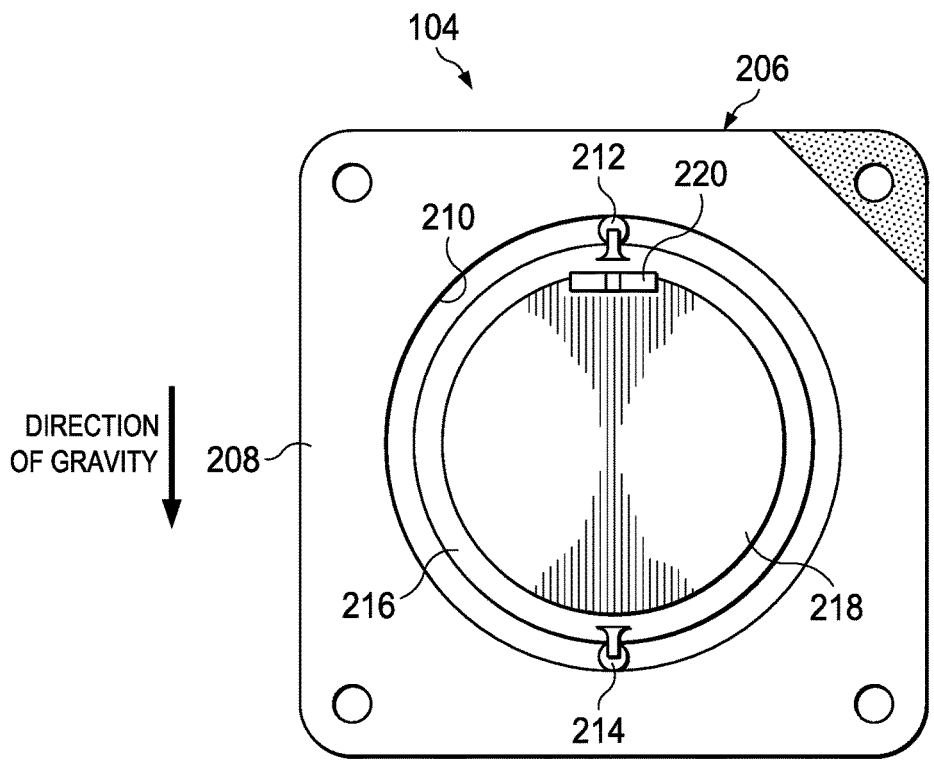
FIGS. 3A-3C illustrate an air mover assembly as it is physically translated between different orientations, in accordance with the present disclosure.
Figure 3B:
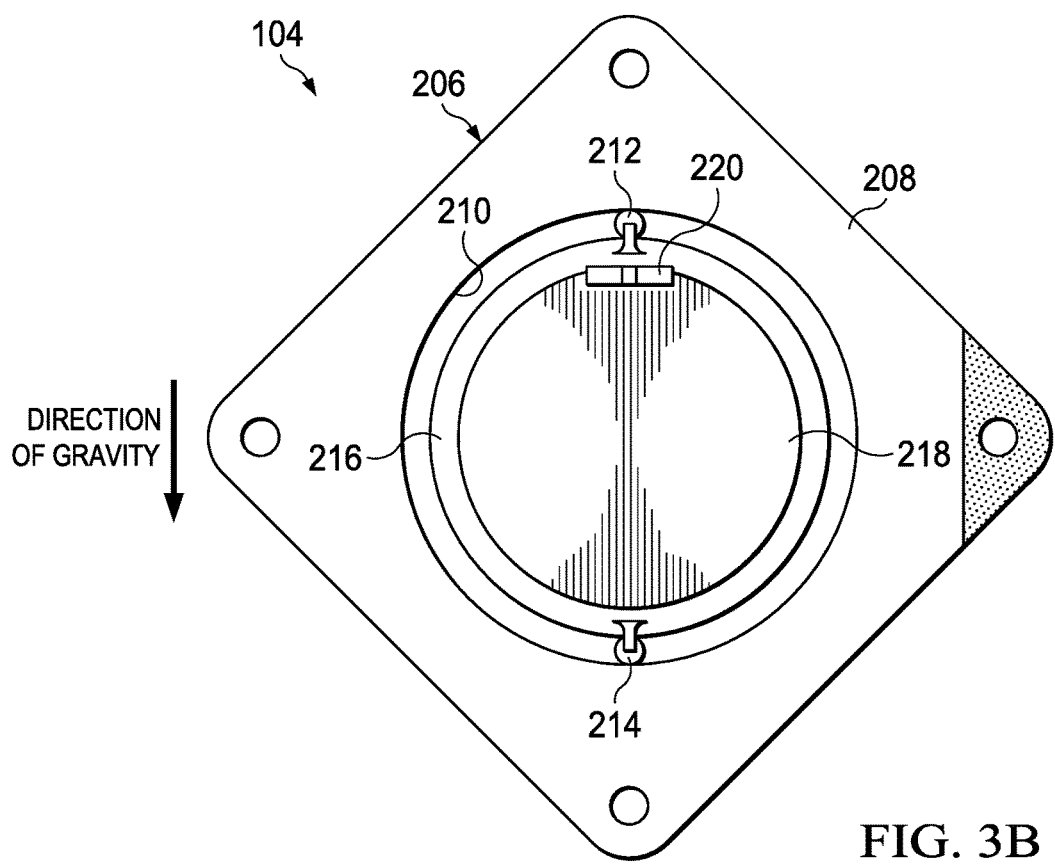
Figure 3C:
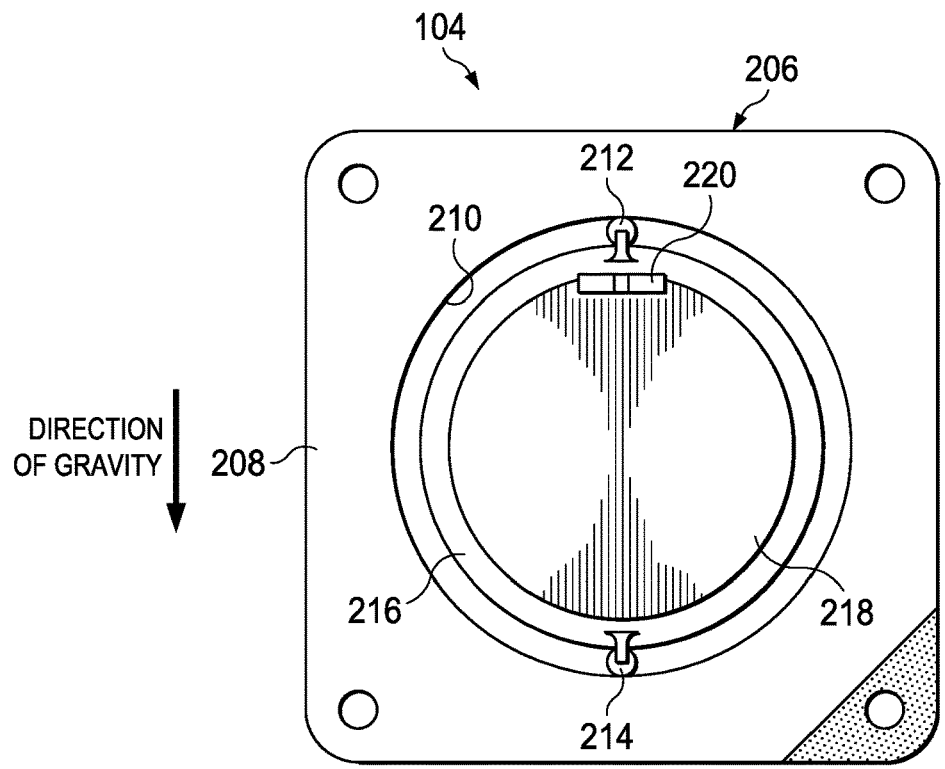

In addition, due to the ability of roller 212 and roller 214 to translate within rail 210, if exhaust plate 208 remains oriented in a plane substantially parallel to a direction of the force of gravity (e.g., a plane defined by a circle defined by rail 210 substantially parallel to a direction of the force of gravity), but an orientation of air mover assembly 104 is changed (e.g., information handling system 100 comprising air mover assembly 104 is rotated 90 degrees from a tower orientation to a rack orientation, or vice versa), roller 212 and roller 214 may translate within rail 210 and cause frame 216, door 218, and hinge 220 to maintain approximately the same orientation with respect to the direction of the force of gravity as the orientation of air mover assembly 104 is changed relative to the direction of the force of gravity. This functionality is depicted in FIGS. 3A-3C which illustrate example air mover assembly 104 as it is physically translated between different orientations, in accordance with embodiments of the present disclosure. In particular, FIG. 3A depicts air mover assembly 104 in a first orientation. As air mover assembly 104 is translated from the first orientation to a second orientation shown in FIG. 3C (with FIG. 3B depicting an intermediate position of air mover assembly 104 between the first orientation and the second orientation), the larger mass of roller 214 relative to roller 212 causes roller 214 to maintain a position below roller 212 in the direction of the force of gravity, such that frame 216, door 218, and hinge 220 maintain approximately the same orientation with respect to the direction of the force of gravity as the orientation of air mover assembly 104 is changed relative to the direction of the force of gravity. To permit such functionality, the mass of roller 214 must be sufficiently larger than that of roller 212 to not only overcome the force of gravity upon roller 212, but also to overcome any other mechanical forces (e.g., friction) that would resist translation of roller 212 and roller 214 within rail 210.

Accordingly, the orientation of air mover 104 may be changed from the first position to the second position (or vice versa), while still allowing door 218 to assume the closed position under the force of gravity when air mover 204 is not operational, and still allowing door 218 to rotate about hinge 220 having an axis generally perpendicular to the force of gravity such that airflow generated by air mover 204 will cause door 218 to assume the open position when air mover 204 is operational.

Figure 4A:
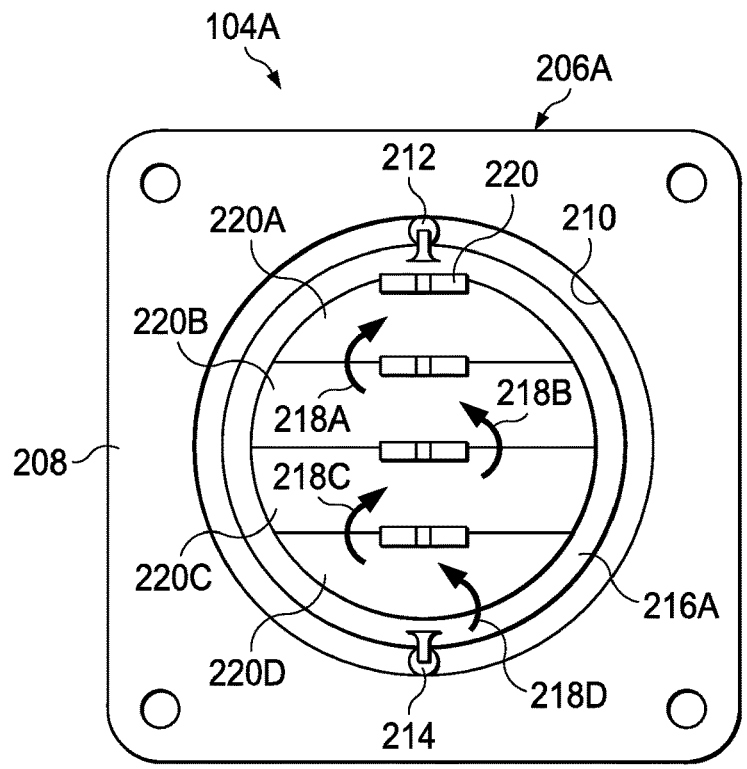
FIGS. 4A and 4B illustrate another air mover assembly, in accordance with the present disclosure.
Figure 4B:
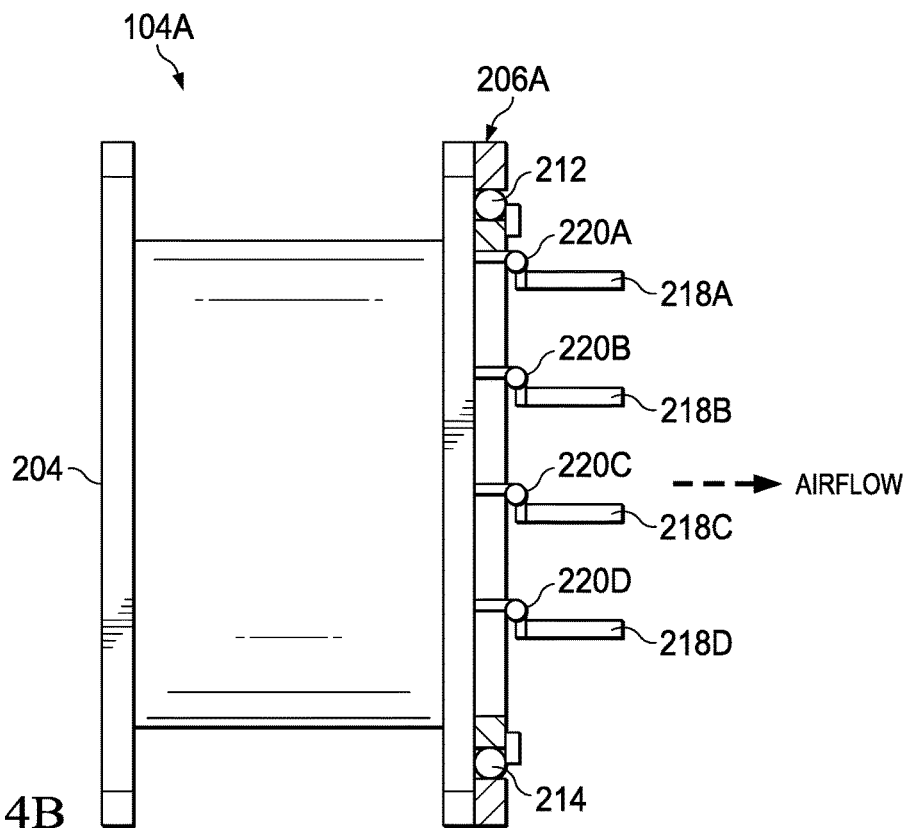

Although FIGS. 2A-2E and 3A-3C depict air mover assembly 104 having a single door 218, in some embodiments, an air mover assembly may have a plurality of doors. For example, FIGS. 4A and 4B illustrate another example air mover assembly 104A, in accordance with the present disclosure. Air mover assembly 104A may be used in lieu of air mover assembly 104. In addition, air mover assembly 104A may be similar in structure and functionality to that of air mover assembly 104, and thus only those differences between air mover assembly 104A and air mover assembly 104 are highlighted below.

As shown in FIGS. 4A and 4B, air mover assembly 104A may have an exhaust assembly 206A including a frame 216A in lieu of frame 216 of air mover assembly 104. A plurality of adjacent doors 218A-218D may be coupled to frame 216A via respective hinges 220A-220D. As so arranged, when air mover 204 is not operational (e.g., due to being powered down or due to suffering an operational fault or failure), the effect of gravity on doors 218A-218D may cause doors 218A-218D to assume a closed position, similar to that shown in FIG. 2D for door 218. On the other hand, when air mover 204 is operational and driving a flow of air, the force of pressure of such airflow on doors 218A-218D may overcome that of the gravitational force on doors 218A-218D, such that doors 218A-218D rotate about their respective hinges 220A-220D to an open position, as shown in FIG. 4B.

Figure 5A:
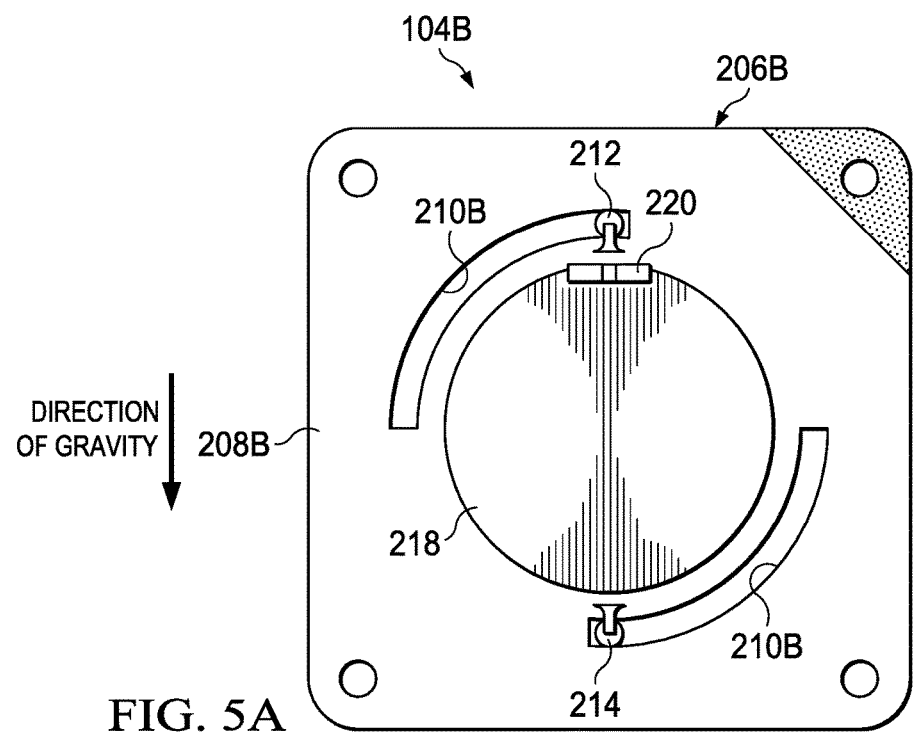
FIGS. 5A-5C illustrate an alternative embodiment of an air mover assembly as it is physically translated between different orientations, in accordance with the present disclosure.
Figure 5B:
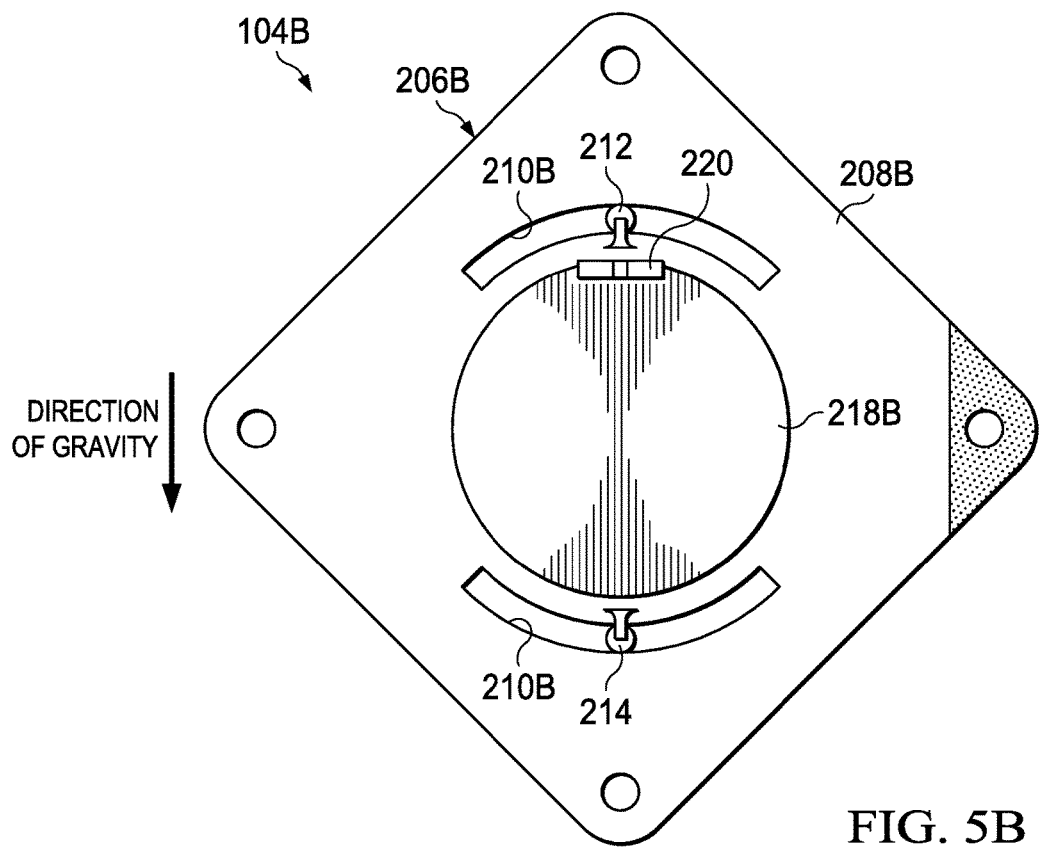
Figure 5C:
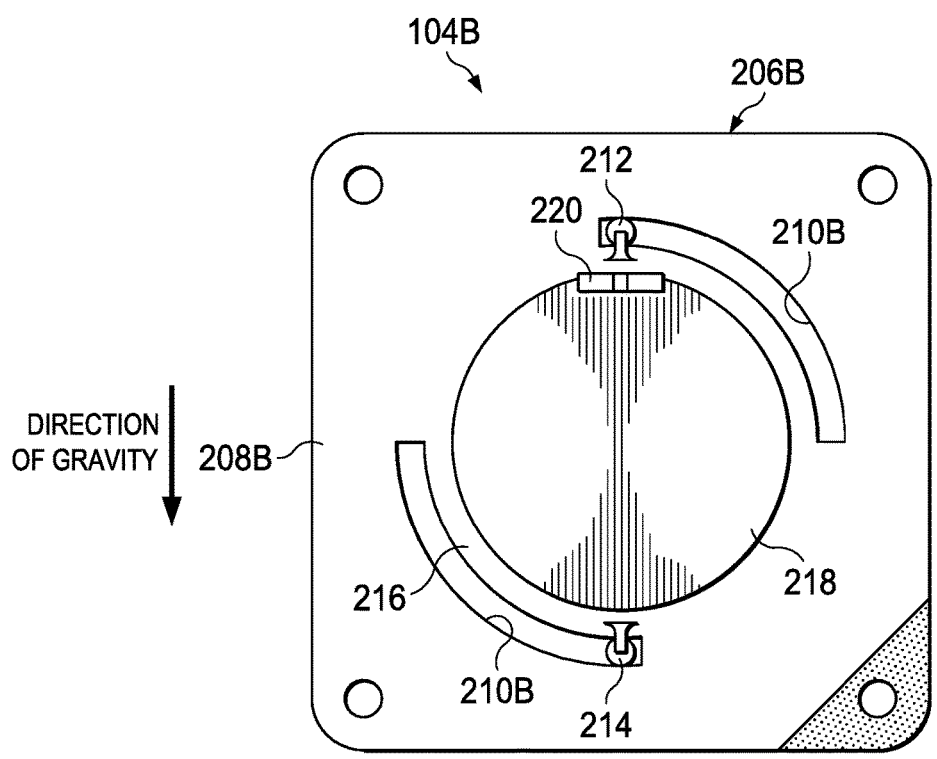

FIGS. 5A-5C illustrate another example air mover assembly 104B as it is physically translated between different orientations, in accordance with embodiments of the present disclosure. As shown in FIGS. 5A-5C, an exhaust plate 208B may be used in lieu of exhaust plate 208. Instead of including a single generally circular rail 210 as in exhaust plate 208, in some embodiments, exhaust plate 208B may include a plurality of rails 210B. Rails 210B may be generally arcuate in shape (e.g., forming portions of a circumference of a circle), and serve as bearings including features necessary to guide and constrain roller 212 and roller 214 within the shapes defined by rails 210B, such that roller 212 and roller 214 may roll within the confines of rails 210B.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. An air mover assembly comprising:
an air mover; and
a housing mechanically coupled to the air mover, the housing comprising an exhaust assembly comprising:
a first roller having a first mass;
a second roller having a second mass larger than the first mass;
at least one generally arcuate rail for constraining motion of the first roller and the second roller within the at least one arcuate rail, wherein the at least one generally arcuate rail includes a first rail to constrain motion of the first roller and a second rail to constrain motion of the second roller, the first and second rails forming portions of a circumference of a circle;
a generally circular frame rotatably coupled to the first roller and the second roller at an approximate circumference of the frame, such that the first roller and the second roller are located diametrically opposite of one another on the approximate circumference; and
a door hingedly coupled to the frame and configured to assume a closed position under a force of gravity on the door in the absence of airflow generated by the air mover and configured to rotate from the closed position to an open position under a force of airflow from the air mover that overcomes the force of gravity on the door;
wherein, as the air mover assembly is rotated from a first orientation to a second orientation, the first roller and the second roller are configured to move about the at least one rail such that the frame and the door maintain a position relative to a direction of the force of gravity.

2. The air mover assembly of claim 1, wherein as the air mover assembly is rotated from the first orientation to the second orientation, the second roller is configured to maintain a position below the first roller with respect to the direction of the force of gravity.

3. The air mover assembly of claim 1, wherein at least one of the first roller and the second roller is coupled to the frame via an axle.

4. The air mover assembly of claim 1, wherein the exhaust assembly further includes at least one other door hingedly coupled to the frame and configured to assume a closed position under the force of gravity on the at least one other door in the absence of airflow generated by the air mover and configured to rotate from the closed position to the open position under a force of airflow from the air mover that overcomes the force of gravity on the at least one other door.

5. The air mover assembly of claim 4, wherein the at least one other door is adjacent to the door.

6. An information handling system comprising:
a chassis; and
an air mover assembly coupled to the chassis and comprising:
an air mover; and
a housing mechanically coupled to the air mover, the housing comprising an exhaust assembly comprising:
a first roller having a first mass;
a second roller having a second mass larger than the first mass;
at least one generally arcuate rail for constraining motion of the first roller and the second roller within the at least one arcuate rail, wherein the at least one generally arcuate rail includes a first rail to constrain motion of the first roller and a second rail to constrain motion of the second roller, the first and second rails forming portions of a circumference of a circle;
a generally circular frame rotatably coupled to the first roller and the second roller at an approximate circumference of the frame, such that the first roller and the second roller are located diametrically opposite of one another on the approximate circumference; and a door hingedly coupled to the frame and configured to assume a closed position under a force of gravity on the door in the absence of airflow generated by the air mover and configured to rotate from the closed position to an open position under a force of airflow from the air mover that overcomes the force of gravity on the door;

wherein, as the air mover assembly is rotated from a first orientation to a second orientation, the first roller and the second roller are configured to move about the at least one rail such that the frame and the door maintain a position relative to a direction of the force of gravity.

7. The information handling system of claim 6, wherein as the air mover assembly is rotated from the first orientation to the second orientation, the second roller is configured to maintain a position below the first roller with respect to the direction of the force of gravity.

8. The information handling system of claim 6, wherein at least one of the first roller and the second roller is coupled to the frame via an axle.

9. The information handling system of claim 6, wherein the exhaust assembly further includes at least one other door hingedly coupled to the frame and configured to assume a closed position under the force of gravity on the at least one other door in the absence of airflow generated by the air mover and configured to rotate from the closed position to the open position under a force of airflow from the air mover that overcomes the force of gravity on the at least one other door.

10. The information handling system of claim 9, wherein the at least one other door is adjacent to the door.

11. A housing for housing an air mover, the housing comprising an exhaust assembly comprising:

a first roller having a first mass;

a second roller having a second mass larger than the first mass;

at least one generally arcuate rail for constraining motion of the first roller and the second roller within the at least one arcuate rail, wherein the at least one generally arcuate rail includes a first rail to constrain motion of the first roller and a second rail to constrain motion of the second roller, the first and second rails forming portions of a circumference of a circle;

a generally circular frame rotatably coupled to the first roller and the second roller at an approximate circumference of the frame, such that the first roller and the second roller are located diametrically opposite of one another on the approximate circumference; and a door hingedly coupled to the frame and configured to assume a closed position under a force of gravity on the door in the absence of airflow generated by the air mover and configured to rotate from the closed position to an open position under a force of airflow from the air mover that overcomes the force of gravity on the door;

wherein, as the housing is rotated from a first orientation to a second orientation, the first roller and the second roller are configured to move about the at least one rail such that the frame and the door maintain a position relative to a direction of the force of gravity.

12. The housing of claim 11, wherein as the housing is rotated from the first orientation to the second orientation, the second roller is configured to maintain a position below the first roller with respect to the direction of the force of gravity.

13. The housing of claim 11, wherein at least one of the first roller and the second roller is coupled to the frame via an axle.

14. The housing of claim 11, wherein the exhaust assembly further includes at least one other door hingedly coupled to the frame and configured to assume a closed position under the force of gravity on the at least one other door in the absence of airflow generated by the air mover and configured to rotate from the closed position to the open position under a force of airflow from the air mover that overcomes the force of gravity on the at least one other door.

15. The housing of claim 14, wherein the at least one other door is adjacent to the door.

* * * * *